(12) United States Patent
Neidorff

(10) Patent No.: US 12,191,755 B2
(45) Date of Patent: Jan. 7, 2025

(54) SWITCH CONTROLLER HAVING A DYNAMIC SCALING CIRCUIT

(71) Applicant: TEXAS INSTRUMENTS INCORPORATED, Dallas, TX (US)

(72) Inventor: Robert Allan Neidorff, Bedford, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 18 days.

(21) Appl. No.: 18/174,645

(22) Filed: Feb. 26, 2023

(65) Prior Publication Data
US 2024/0291469 A1  Aug. 29, 2024

(51) Int. Cl.
  *H02M 1/08* (2006.01)
  *H03K 3/012* (2006.01)

(52) U.S. Cl.
  CPC .............. *H02M 1/08* (2013.01); *H03K 3/012* (2013.01)

(58) Field of Classification Search
  CPC ................................ H02M 1/08; H03K 3/012
  USPC .................................. 327/108, 109, 518, 520
  See application file for complete search history.

(56) References Cited

U.S. PATENT DOCUMENTS

| | | | |
|---|---|---|---|
| 7,046,046 B2 * | 5/2006 | Temes ................... | H03M 3/486 341/172 |
| 11,588,471 B1 * | 2/2023 | Ramamurthy ..... | H03H 11/1252 |
| 2016/0173086 A1 * | 6/2016 | Chiang ................ | G11C 27/026 327/434 |
| 2018/0045779 A1 * | 2/2018 | Cao ........................ | H02M 3/156 |
| 2020/0286574 A1 * | 9/2020 | Kunz ...................... | G05F 3/262 |

* cited by examiner

*Primary Examiner* — William Hernandez
(74) *Attorney, Agent, or Firm* — Charles F. Koch; Frank D. Cimino

(57) ABSTRACT

A dynamic scaling circuit includes: a damping control circuit; a sampling circuit; and a controller. The damping control circuit has a first input, a second input, a third input, an output, and a ground terminal. The sampling circuit has a first input, a second input, an output, and a ground terminal. The first input of the sampling circuit is coupled to the output of the damping control circuit. The controller has an input, a first output, a second output, and a third output. The first output of the controller is coupled to the second input of the damping control circuit. The second output of the controller is coupled to the third input of the damping control circuit. The third output of the controller is coupled to the second input of the sampling circuit.

8 Claims, 11 Drawing Sheets

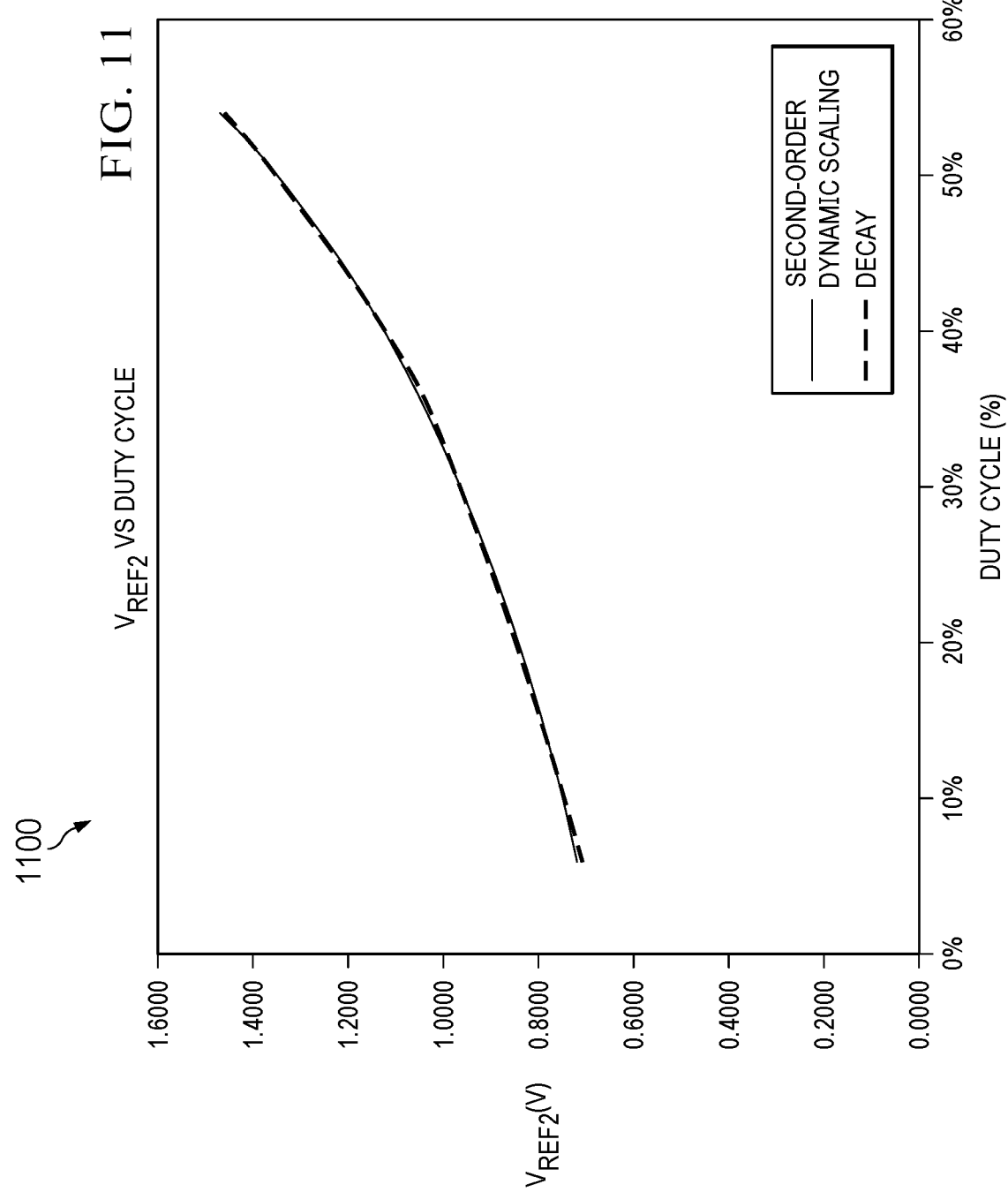

SWITCH CONTROLLER HAVING A DYNAMIC SCALING CIRCUIT

BACKGROUND

Many electronic devices include power management circuitry. Examples of power management circuitry include voltage converters and charger circuitry. Some types of power management circuitry include one or more switches and a related controller. Control of each such switch may vary depending on the load, a current limit, availability of different power sources, and/or other control parameters. Efforts to reduce the cost and complexity of such controllers are ongoing.

SUMMARY

In an example, a dynamic scaling circuit includes: a damping control circuit; a sampling circuit; and a controller. The damping control circuit has a first input, a second input, a third input, an output, and a ground terminal. The sampling circuit has a first input, a second input, an output, and a ground terminal. The first input of the sampling circuit is coupled to the output of the damping control circuit. The controller has an input, a first output, a second output, and a third output. The first output of the controller is coupled to the second input of the damping control circuit. The second output of the controller is coupled to the third input of the damping control circuit. The third output of the controller is coupled to the second input of the sampling circuit.

In another example, a circuit includes a switch controller. The switch controller includes: a reference voltage source configured to provide a reference voltage; a timing controller configured to provide a timing signal; a dynamic scaling circuit configured to provide a damped version of the reference voltage responsive to the timing signal; and control circuitry configured to provide a switch control signal responsive to the damped version of the reference voltage.

In yet another example, a system includes: mobile device circuitry; and power management circuitry coupled to the mobile device circuitry. The power management circuitry includes a switch controller. The switch controller includes a dynamic scaling circuit configured to: receive a reference voltage and a timing signal; generate a first control signal, a second control signal, a third control signal, and a fourth control signal responsive to the timing signal; control charge on a capacitor responsive to the reference voltage, the first control signal, the second control signal, and the third control signal; and sample a charge level of the capacitor responsive to the fourth control signal.

BRIEF DESCRIPTION OF THE DRAWINGS

FIG. 11 is a graph comparing dynamic scaling results as a function of duty-cycle for second-order dynamic scaling relative to an ideal curve.

DETAILED DESCRIPTION

Figure 1:
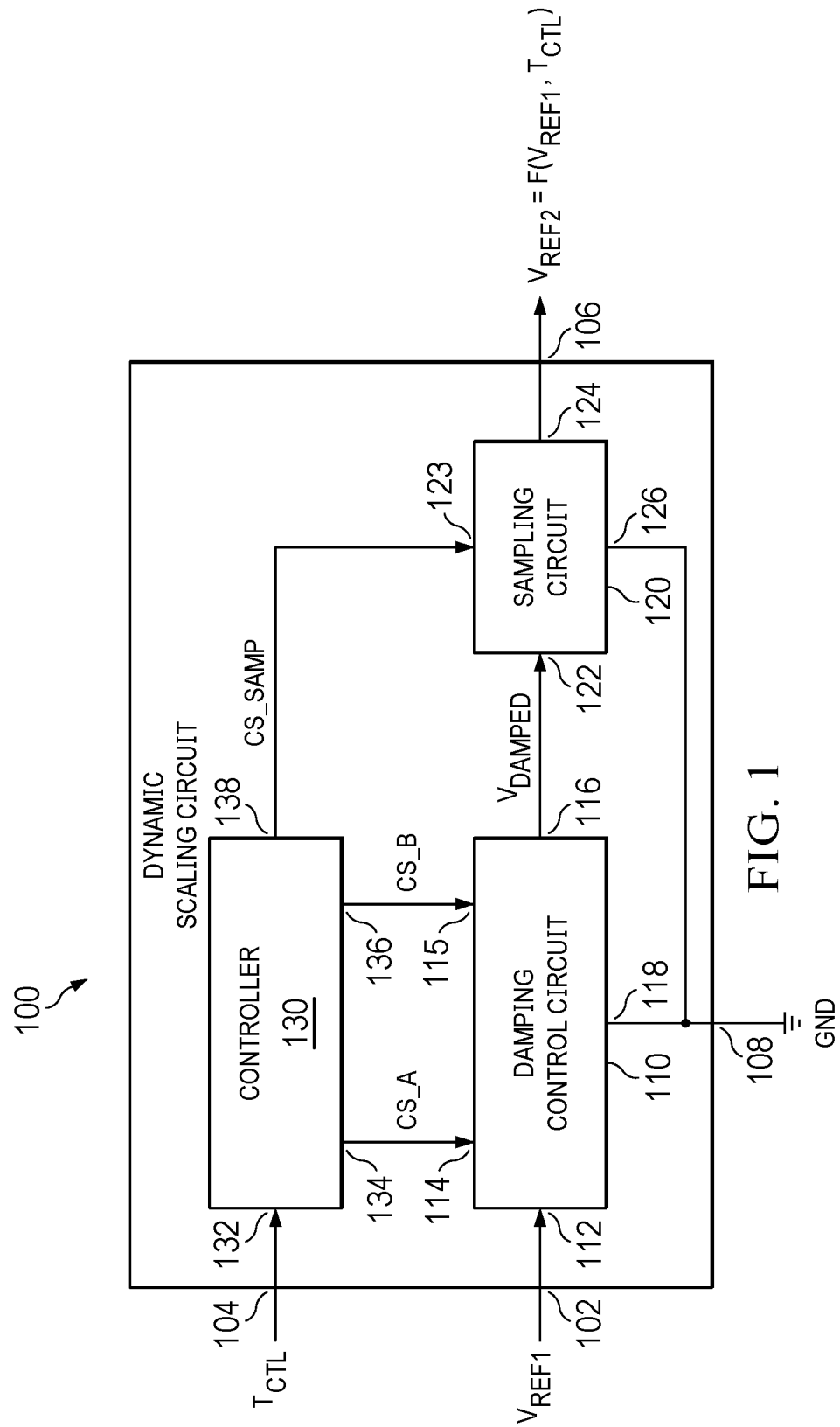
FIG. 1 is a block diagram showing a dynamic scaling circuit in accordance with an example embodiment.

The same reference numbers or other reference designators are used in the drawings to designate the same or similar features. Such features may be the same or similar either by function and/or structure.

In the described embodiments, a dynamic scaling circuit is configured to provide a damped version of a reference voltage responsive to a timing signal. In some example embodiments, the dynamic scaling circuit is part of a switch controller for a switch. The switch may be part of the power management circuitry of an electronic device such as a mobile electronic device. Without limitation, the reference voltage may be based on a maximum current or power level for the power management circuitry and the timing signal may be based on a duty-cycle of the switch. The duty-cycle and the related timing signal may vary over time.

FIG. 1 is a block diagram showing a dynamic scaling circuit 100 in accordance with an example embodiment. In the example of FIG. 1, the dynamic scaling circuit 100 has a first input 102, a second input 104, an output 106, and a ground terminal 108. The dynamic scaling circuit 100 includes a damping control circuit 110, a sampling circuit 120, and a controller 130. The damping control circuit has a first input 112, a second input 114, a third input 115, an output 116, and a ground terminal 118. The sampling circuit 120 has a first input 122, a second input 123, an output 124, and a ground terminal 126. The controller 130 has an input 132, a first output 134, a second output 136, and a third output 138.

The first input 112 of the damping control circuit 110 is coupled to the first input 102 of the dynamic scaling circuit 100. The second input 114 of the damping control circuit 110 is coupled to the first output 134 of the controller 130. The third input 115 of the damping control circuit 110 is coupled to the second output 136 of the controller 130. The output 116 of the damping control circuit 110 is coupled to the first input 122 of the sampling circuit 120. The ground terminal 118 of the damping control circuit 110 is coupled to the ground terminal 108 of the dynamic scaling circuit 100. The second input 123 of the sampling circuit 120 is coupled to the third output 138 of the controller 130. The output 124 of the sampling circuit 120 is coupled to the output 106 of the dynamic scaling circuit 100. The ground terminal 126 of the sampling circuit 120 is coupled to the ground terminal 108 of the dynamic scaling circuit 100.

In operation, the dynamic scaling circuit 100 is configured to: 1) receive a reference voltage ($V_{REF1}$) at its first input 102; 2) receive a timing signal ($T_{CTL}$) at its second input 104; and provide a second reference signal ($V_{REF2}$) at its output 106 responsive to $V_{REF1}$ and $T_{CTL}$. In other words, $V_{REF2}$ is a function of $V_{REF1}$ and $T_{CTL}$ ($V_{REF2}$=F($V_{REF1}$, $T_{CTL}$)). In some examples, $V_{REF1}$ is based on a current limit for a switch or related power management circuitry of a mobile device. $V_{REF1}$ may vary for different examples. In some examples, $T_{CTL}$ is based on the on-time of a switch. $T_{CTL}$ may vary over time based on load, a target output voltage ($V_{OUT}$) for the power management circuitry, an input voltage ($V_{IN}$) for the power management circuitry, and/or other control parameters.

In some examples, the controller 130 is configured to: receive $T_{CTL}$ at its input 132; provide CS_A at its first output 134 responsive to $T_{CTL}$; provide CS_B at its second output 136 responsive to $T_{CTL}$; and provide CS_SAMP at its third output 138 responsive to $T_{CTL}$. In some examples, the damping control circuit 110 is configured to: receive $V_{REF1}$ at its first input 112; receive CS_A at its second input 114; receive CS_B at its third input 115; and provide $V_{DAMPED}$ at its output 116 responsive to $V_{REF1}$, CS_A, and CS_B. In some examples, the sampling circuit 120 is configured to: receive $V_{DAMPED}$ at its first input 122; receive CS_SAMP at its second input 123; sample $V_{DAMPED}$ responsive to CS_SAMP; and provide $V_{REF2}$ at its output 124 responsive to the sample of $V_{DAMPED}$. In some examples, the sampling circuit 120 is configured to buffer $V_{DAMPED}$ to expedite sampling operations.

Figure 2:
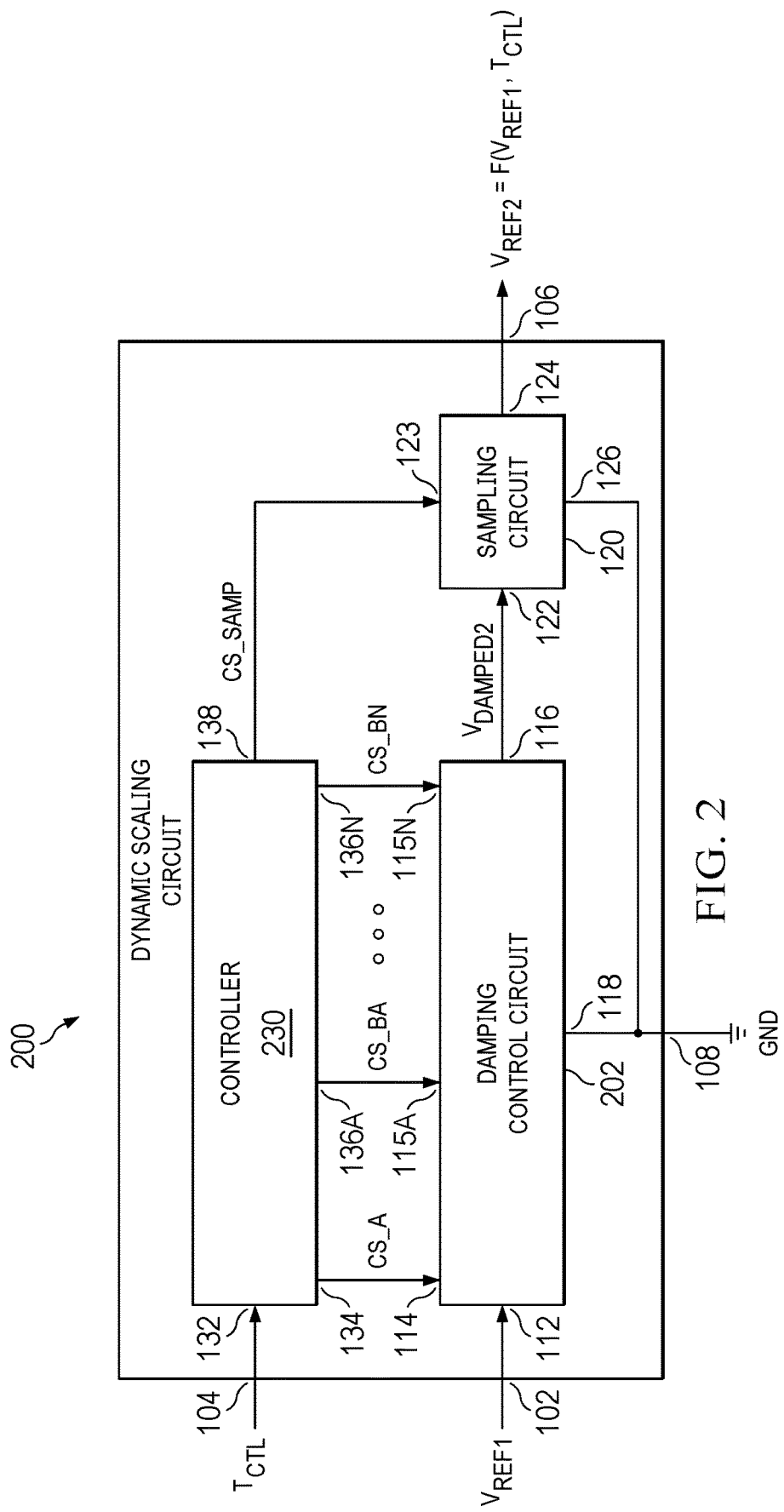
FIG. 2 is a schematic diagram showing another dynamic scaling circuit in accordance with an example embodiment.

FIG. 2 is a schematic diagram showing another dynamic scaling circuit 200 in accordance with an example embodiment. In the example of FIG. 2, the dynamic scaling circuit 200 has the first input 102, the second input 104, the output 106, and the ground terminal 108 described in FIG. 1. The dynamic scaling circuit 200 includes a damping control circuit 202, the sampling circuit 120, and a controller 230. The damping control circuit 202 has the first input 112, the second input 114, a set of third inputs 115A to 115N, the output 116, and the ground terminal 118. The sampling circuit 120 has the first input 122, the second input 123, the output 124, and the ground terminal 126 described in FIG. 1. The controller has the input 132, the first output 134, a set of second outputs 136A to 136N, and the third output 138.

The first input 112 of the damping control circuit 202 is coupled to the first input 102 of the dynamic scaling circuit 200. The second input 114 of the damping control circuit 202 is coupled to the first output 134 of the controller 230. The set of third inputs 115A to 115N of the damping control circuit 202 are respectively coupled to the set of second outputs 136A to 136N of the controller 230. The output 116 of the damping control circuit 202 is coupled to the first input 122 of the sampling circuit 120. The ground terminal 118 of the damping control circuit 202 is coupled to the ground terminal 108 of the dynamic scaling circuit 200. The second input 123 of the sampling circuit 120 is coupled to the third output 138 of the controller 230. The output 124 of the sampling circuit 120 is coupled to the output 106 of the dynamic scaling circuit 200. The ground terminal 126 of the sampling circuit 120 is coupled to the ground terminal 108 of the dynamic scaling circuit 200.

In operation, the dynamic scaling circuit 200 is configured to: 1) receive $V_{REF1}$ at its first input 102; 2) receive $T_{CTL}$ at its second input 104; and provide $V_{REF2}$ at its output 106 responsive to $V_{REF1}$ and $T_{CTL}$. Again, $V_{REF2}$ is a function of $V_{REF1}$ and $T_{CTL}$ ($V_{REF2}$=F($V_{REF1}$, $T_{CTL}$)). In some examples, $V_{REF1}$ is based on a current limit for a switch or related power management circuitry of a mobile device. $V_{REF1}$ may vary for different examples. In some examples, $T_{CTL}$ is based on the on-time of a switch. $T_{CTL}$ may vary over time based on load, a target $V_{OUT}$ for the power management circuitry, $V_{IN}$ for the power management circuitry, and/or other control parameters.

In some examples, the controller 230 is configured to: receive $T_{CTL}$ at its input 132; provide CS_A at its first output 134 responsive to $T_{CTL}$; provide CS_BA to CS_BN at its set of second outputs 136A to 136N responsive to $T_{CTL}$ and one or more timers (e.g., part of the controller 230); and provide CS_SAMP at its third output 138 responsive to $T_{CTL}$. In some examples, the damping control circuit 110 is configured to: receive $V_{REF1}$ at its first input 112; receive CS_A at its second input 114; receive CS_BA to CS_BN at its set of third input 115A to 115N; and provide $V_{DAMPED}$ at its output 116 responsive to $V_{REF1}$, CS_A, and CS_BA to CS_BN. In some examples, the sampling circuit 120 is configured to: receive $V_{DAMPED}$ at its first input 122; receive CS_SAMP at its second input 123; sample $V_{DAMPED}$ responsive to CS_SAMP; and provide $V_{REF2}$ at its output 124 responsive to the sample of $V_{DAMPED}$. In some examples, the sampling circuit 120 is configured to buffer $V_{DAMPED}$ to expedite sampling operations.

Figure 3:
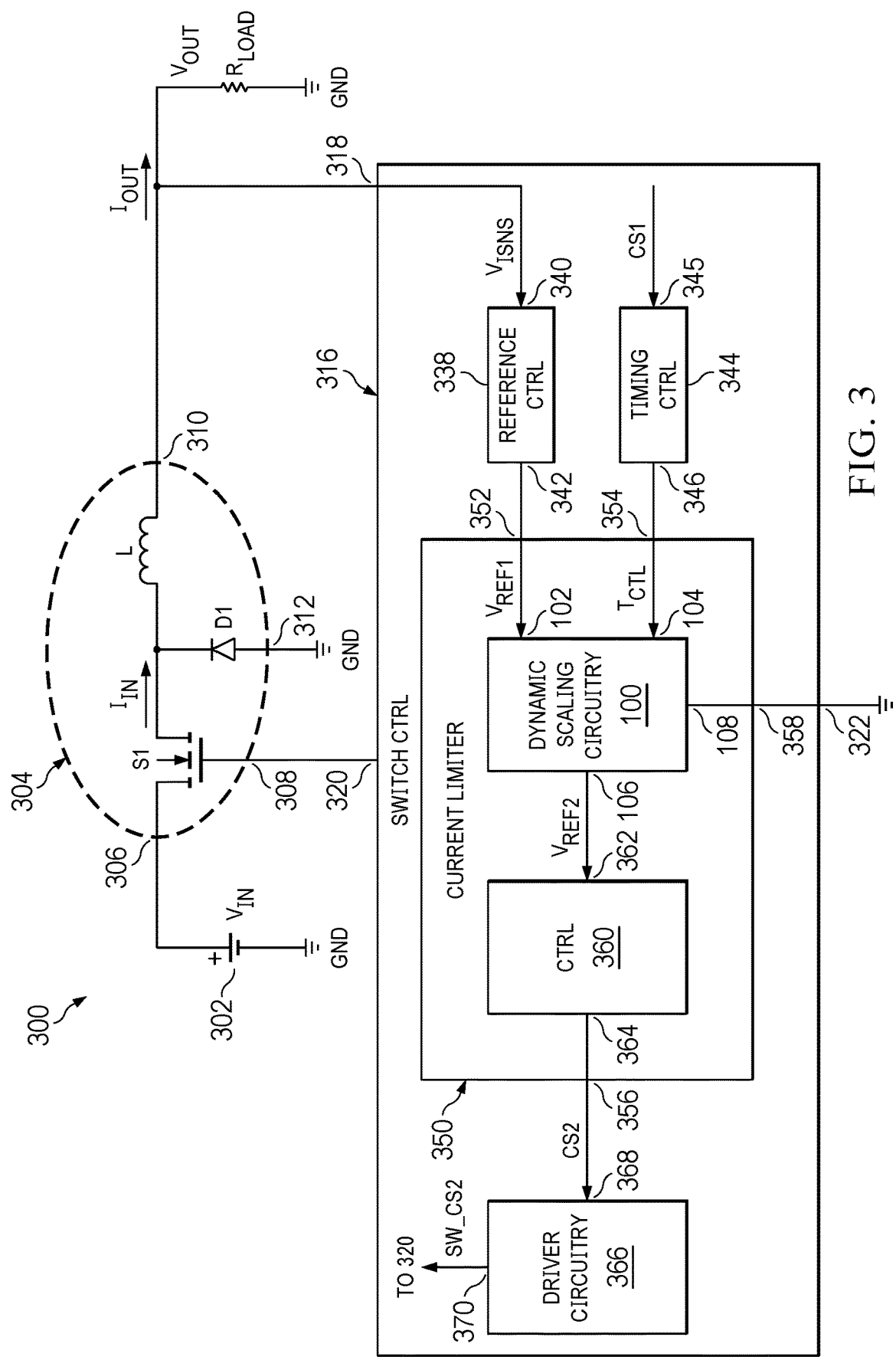
FIG. 3 is a circuit diagram showing a system in accordance with an example embodiment.

FIG. 3 is a circuit diagram showing a system 300 in accordance with an example embodiment. In the example of FIG. 3, the system 300 includes a power supply 302, power management circuitry 304, a load ($R_{LOAD}$), and a switch controller 316. The power management circuitry 304 has a first input 306, a second input 308, an output 310, and a ground terminal 312. The switch controller 316 has an input 318, an output 320, and a ground terminal 322. The first input 306 of the power management circuitry 304 is coupled to a first side of the power supply 302 and receives an input voltage (VIN). The second input 308 of the power management circuitry 304 is coupled to the output 320 of the switch controller 316. The output 310 of the power management circuitry 304 is coupled to a first side of $R_{LOAD}$ and provide an output voltage ($V_{OUT}$). The output 310 of the power management circuitry 304 is also coupled to the input 318 of the switch controller 316.

In some examples, the power management circuitry includes a switch S1, a diode D1, and an inductor L. Switch S1 has a first current terminal, a second current terminal, and a control terminal. The first current terminal of switch S1 is coupled to the first input 306 of the power management circuitry 304. The second current terminal of switch S1 is coupled to the cathode of diode D1 and a first side of inductor L. The control terminal of switch S1 is coupled to the second input 308 of the power management circuitry 304. The anode of diode D1 is coupled to the ground terminal 312 of the power management circuitry 304. The second side of inductor L is coupled to the output 310 of the power management circuitry 304.

In the example of FIG. 3, the switch controller 316 includes a reference controller 338, a timing controller 344, a current limiter 350, and driver circuitry 366. The reference controller 338 has an input 340 and an output 342. The timing controller 344 has input 345 and an output 346. The current limiter 350 has a first input 352, a second input 354, an output 356, and a ground terminal 358. The driver circuitry 366 has an input 368 and an output 370.

In some examples, the current limiter 350 includes the dynamic scaling circuit 100 of FIG. 1 and a controller 360. The controller 360 has an input 362 and an output 364. In such examples, the first input 102 of the dynamic scaling circuit 100 is coupled to the first input 352 of the current limiter 350. The second input 104 of the dynamic scaling circuit 100 is coupled to the second input 354 of the current limiter 350. The output 106 of the dynamic scaling circuit 100 is coupled to the input 362 of the controller 360. The output of the controller 360 is coupled to the output 356 of the current limiter 350. The ground terminal 108 of the dynamic scaling circuit 100 is coupled to the ground terminal 358 of the current limiter 350. In other examples, the current limiter 350 includes the dynamic scaling circuit 200 of FIG. 2. In such examples, the current limiter 350 would include multiple inputs (not shown) to receive multiple timing control signals (e.g., $T_{CTL1}$ to $T_{CTLN}$). Also, the timing controller 344 would include multiple outputs (not shown) to provide multiple timing control signals (e.g., $T_{CTL1}$ to $T_{CTLN}$).

The input 340 of the reference controller 338 is coupled to the input 318 of the switch controller 316. The output 342 of the reference controller 338 is coupled to the first input 352 of the current limiter 350. The input 345 of the timing controller 344 is configured to receive a control signal (CS1). In some examples, CS1 is $V_{OUT}$. The output 346 of the timing controller 344 is coupled to the second input 354 of the current limiter 350. The output 356 of the current limiter 350 is coupled to the input 368 of the driver circuitry 366. The ground terminal 358 of the current limiter 350 is coupled to the ground terminal 322 of the switch controller 316. The input 368 of the driver circuitry 366 is coupled to the output 356 of the current limiter 350. The output 370 of the driver circuitry 366 is coupled to the output 320 of the switch controller 316.

In operation, the power management circuitry 304 is configured to provide $V_{OUT}$ to $R_{LOAD}$ responsive to $V_{IN}$ and the operations of the switch controller 316. The switch controller 316 is configured to control S1 responsive to $V_{OUT}$, a target $V_{OUT}$, and a current limit for $I_{OUT}$. The reference controller 338 is configured to: receive a sense signal at its input 340; and provide $V_{REF1}$ responsive to the sense signal. In some examples, the reference controller 338 includes a sense circuit, an $I_{OUT}$ regulation digital-to-analog converter (DAC), and/or other components. In some examples, $V_{REF1}$ is based on a current limit for $I_{OUT}$. The timing controller 344 is configured to: receive CS1 at its input 345; and provide $T_{CTL}$ at its output 346. In some examples, $T_{CTL}$ is based on the on-time and/or duty-cycle of S1. The current limiter 350 is configured to: receive $V_{REF1}$ at its first input 352; receive $T_{CTL}$ at its second input 354; and provide a control signal (CS2) at its output 356 responsive to $V_{REF1}$, $T_{CTL}$, the operations of the dynamic scaling circuit 100, and the operations of the controller 360. More specifically, the dynamic scaling circuit 100 is configured to: receive $V_{REF1}$ at its first input 102; receive $T_{CTL}$ at its second input 104; and provide $V_{REF2}$ at its output 356 responsive to $V_{REF1}$ and $T_{CTL}$. The controller 360 is configured to: receive $V_{REF2}$ at its input 362; and provide CS2 at its output 364 responsive to $V_{REF2}$. In some examples, the controller 360 is configured to control CS2 responsive to a comparison of $V_{REF2}$ with a current sense signal (e.g., $V_{ISNS}$ in FIG. 5) proportional to $I_{OUT}$. For example, if $V_{REF2}$ is higher than the current sense signal, CS2 has a first state (e.g., a logical "0" state). If the $V_{REF2}$ is lower than the current sense signal, CS2 has a second state (e.g., a logical "1" state). The driver circuitry 366 is configured to: receive CS2 at its input 368; and provide a switch control signal (SW_CS2) at its output 370 responsive to CS2. SW_CS2 is provided to the control terminal of S1 via the output 320 of the switch controller 316.

Figure 4:
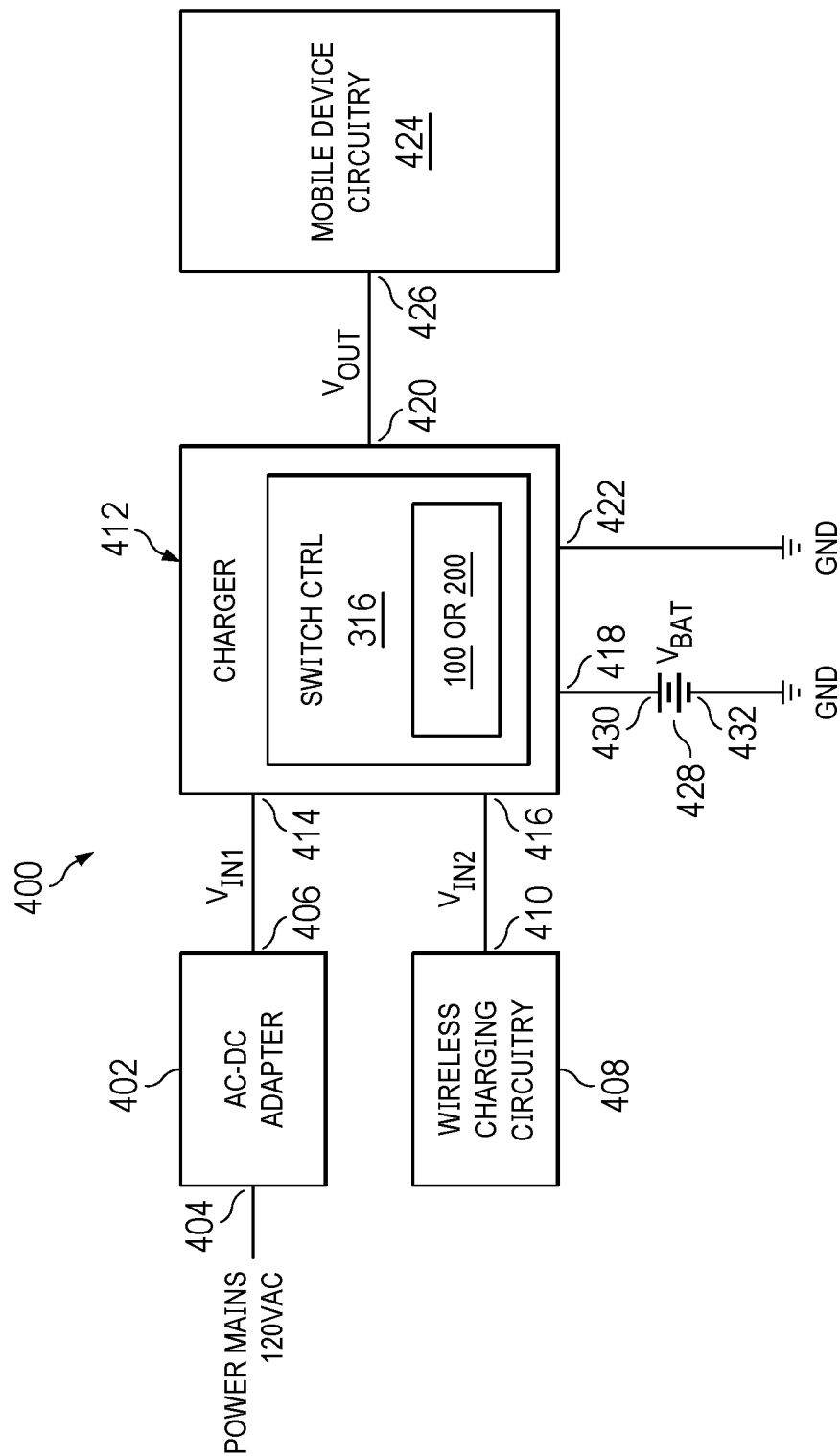
FIG. 4 is a block diagram showing another system in accordance with an example embodiment.

FIG. 4 is a block diagram showing another system 400 in accordance with an example embodiment. As shown, the system 400 includes an alternating-current to direct-current (AC-DC) adapter 402, wireless charging circuitry 408, a charger 412, a battery 428, and mobile device circuitry 424. The AC-DC adapter 402 has an input 404 and an output 406. The wireless charging circuitry 408 has an output 410. The charger 412 has a first input 414, a second input 416, a third input 418, an output 420, and a ground terminal 422. As shown, the charger 412 includes the switch controller 316 described in FIG. 3. In some examples, the charger 412 is an example of power management circuitry such as the power management circuitry 304 of FIG. 3. The switch controller 316 represented in FIG. 4 includes a dynamic scaling circuit such as the dynamic scaling circuit 100 of FIG. 1, or the dynamic scaling circuit 200 of FIG. 2. The battery 428 has a positive terminal 430 and a negative terminal 432. The mobile device circuitry 424 includes an input 426.

In the example of FIG. 4, the input 404 of the AC-DC adapter 402 is configured to receive an AC signal such as a 120 VAC signal. The output 406 of the AC-DC adapter 402 is coupled to the first input 414 of the charger 412. The output 410 of the wireless charging circuitry 408 is coupled to the second input 416 of the charger 412. The positive terminal 430 of the battery 428 is coupled to the third input 418 of the charger 412. The negative terminal 432 of the battery is coupled to a ground terminal. The output 420 of the charger 412 is coupled to the input 426 of the mobile device circuitry 424.

In operation, the AC-DC adapter 402 is configured to: receive an AC signal at its input 404; and provide a first DC input voltage ($V_{IN1}$) at its output 406 responsive to the AC signal. The wireless charging circuitry 408 is configured to provide a second DC input voltage ($V_{IN2}$) responsive to proximity of the system 400 to a wireless charger (not shown). The charger 412 is configured to provide $V_{OUT}$ to the mobile device circuitry 424 responsive to $V_{IN1}$ if available, $V_{IN2}$ if available, and/or a battery voltage ($V_{BAT}$) if available. The charger 412 is also configured to charge the battery 428 responsive to a charge level of the battery 428 and availability of $V_{IN1}$ and/or $V_{IN2}$. The switch controller 316 operates to control a switch (not shown) of the charger 412. In some examples, the switch controller 316 of the charger 412 performs current limit operations based on the dynamic scaling circuit 100 or 200. The current limit operations may limit the current output to the mobile device circuitry 424 and/or current internal to the charger 412.

Figure 5:
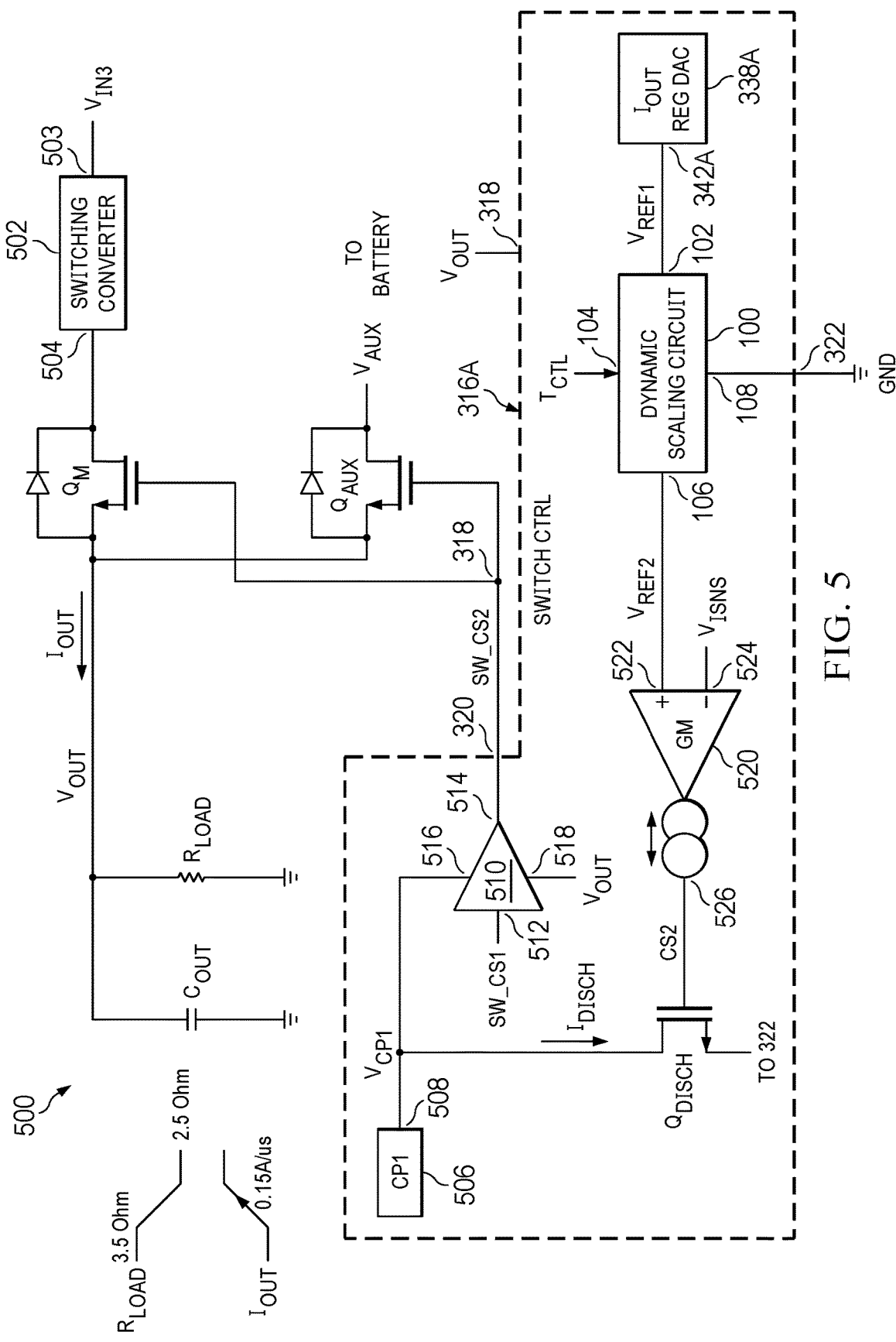
FIG. 5 is a circuit diagram showing another system in accordance with an example embodiment.

FIG. 5 is a circuit diagram showing another system 500 in accordance with an example embodiment. As shown, the system 500 includes a switching converter 502, a first transistor $Q_M$, a second transistor $Q_{AUX}$, an output capacitor ($C_{OUT}$), $R_{LOAD}$, and a switch controller 316A. The switch controller 316A is an example of the switch controller 316 in FIG. 3.

In the example of FIG. 5, the switching converter 502 has an input 503 and an output 504. $Q_M$ has a first current terminal, a second current terminal, and a control terminal. $Q_{AUX}$ has a first current terminal, a second current terminal, and a control terminal. $C_{OUT}$ has a first side and a second side. $R_{LOAD}$ has a first side and a second side. The switch controller 316A has the input 318, the output 320, and the ground terminal 322 described in FIG. 3.

The input 503 of the switching converter 502 is coupled to a power supply (not shown) and receives an input voltage ($V_{IN3}$). $V_{IN3}$ is an example of $V_{IN}$ in FIG. 3, $V_{IN1}$ in FIG. 4, or $V_{IN2}$ in FIG. 4. The output 504 of the switching converter 502 is coupled to the first current terminal of $Q_M$. The second current terminal of $Q_M$ is coupled to the first sides of $C_{OUT}$ and $R_{LOAD}$. The control terminal of $Q_M$ is coupled to the output 320 of the switch controller 316A. The first current terminal of $Q_{AUX}$ is coupled to a $V_{AUX}$ source (not shown) such as a battery. The second current terminal of $Q_{AUX}$ is coupled to the first sides of $R_{LOAD}$ and $C_{OUT}$. The second sides of $R_{LOAD}$ and $C_{OUT}$ are coupled to a ground terminal. In some examples, $R_{LOAD}$ varies between about 2.5 ohms to about 3.5 ohms during operations of the system 500. In some examples, $I_{OUT}$ increase by about 0.15 A/us responsive to $R_{LOAD}$ dropping from 3.5 ohms to 2.5 ohms.

In the example of FIG. 5, the switch controller 316A includes an $I_{OUT}$ regulation DAC 338A, the dynamic scaling circuit 100, a compare circuit 520, a transistor $Q_{DISCH}$, a charge pump 506, and a buffer 510. The $I_{OUT}$ regulation DAC 338A is an example of the reference controller 338 in FIG. 3. In some examples, the dynamic scaling circuit 100 in FIG. 5 is replaced by the dynamic scaling circuit 200.

As shown, the $I_{OUT}$ regulation DAC 338A has an output 342A. The output 342A is an example of the output 342 of the reference controller 338. The $I_{OUT}$ regulation DAC 338A may also have an input (not shown) comparable to the input 340 of the reference controller 338. The dynamic scaling circuit 100 has the first input 102, the second input 104, the output 106, and the ground terminal 108 described in FIG. 1. The compare circuit 520 has a non-inverting input 522, an inverting input 524, and an output 526. $Q_{DISCH}$ has a first current terminal, a second current terminal, and a control terminal. The charge pump 506 has an output 508. The buffer 510 has an input 512, an output 514, a power input 516, a ground terminal 518.

The output 342A of the $I_{OUT}$ regulation DAC 338A is coupled to the first input 102 of the dynamic scaling circuit 100. The second input 104 of the dynamic scaling circuit 100 may be coupled to a timing controller (not shown) such as the timing controller 344 of FIG. 3. The output 106 of the dynamic scaling circuit 100 is coupled to the non-inverting input 522 of the compare circuit 520. The ground terminal 108 of the dynamic scaling circuit 100 is coupled to the ground terminal 322 of the switch controller 316A. The inverting input 524 of the compare circuit 520 may be coupled to a current sense circuit (not shown) and receives a current sense signal ($V_{ISNS}$) that is proportional to $I_{OUT}$. The output 526 of the compare circuit 520 is coupled to the control terminal of $Q_{DISCH}$. The first current terminal of $Q_{DISCH}$ is coupled to the output 508 of the charge pump 506. The second current terminal of $Q_{DISCH}$ is coupled to the ground terminal 322 of the switch controller 316A. The output 508 of the charge pump 506 is also coupled to the power input 516 of the buffer 510. The input 512 of the buffer 510 is coupled to a controller (now shown) configured to provide a switch control signal (SW_CS1). The output 514 of the buffer 510 is coupled to the output 320 of the switch controller 316A and provides SW_CS2. The ground terminal 518 of the buffer 510 is coupled to the input 318 of the switch controller 316A and receives $V_{OUT}$.

In operation, the switching converter 502 is configured to provide $V_{OUT}$ at its output 504 responsive to $V_{IN3}$ at its input 503 and a target $V_{OUT}$. Examples of the switching converter 502 include a buck converter, a boost converter, or a buck-boost converter. $Q_M$ is configured to selectively supply $V_{OUT}$ and $I_{OUT}$ to $R_{LOAD}$ responsive to SW_CS2 at the control terminal of $Q_M$. $Q_{AUX}$ is configured to selectively supply $V_{AUX}$ to $R_{LOAD}$ responsive to SW_CS2 at the control terminal of $Q_{AUX}$. In some examples, $V_{AUX}$ is a battery voltage that helps maintain $V_{OUT}$ at a target $V_{OUT}$. $C_{OUT}$ operates to smooth voltage changes for $R_{LOAD}$.

The $I_{OUT}$ regulation DAC 338A is configured to provide $V_{REF1}$ at its output 342A responsive to a current limit for $R_{LOAD}$ and/or a current limit for power management circuitry such as $Q_M$ and the switching converter 502 in FIG. 5. The dynamic scaling circuit 100 is configured to: receive $V_{REF1}$ at its first input 102; receive $T_{CTL}$ at its second input 104; and provide $V_{REF2}$ at its output 106 responsive to $V_{REF1}$ and $T_{CTL}$. The compare circuit 520 is configured to: receive $V_{REF2}$ at its non-inverting input 522; receive $V_{ISNS}$ at its inverting input 524; and provide CS2 at its output 526 responsive to a comparison of $V_{REF2}$ with $V_{ISNS}$. In some examples, CS2 is de-asserted when $V_{REF2}$ is higher than $V_{ISNS}$. Otherwise, when $V_{REF2}$ is lower than $V_{ISNS}$, CS2 is asserted. $Q_{DISCH}$ is configured to turn on and allow current flow to ground responsive to CS2 being asserted. Otherwise, when CS2 is de-asserted, $Q_{DISCH}$ is turned off. The charge pump 506 is configured to provide a charge pump voltage ($V_{CP1}$) at its output 508. The buffer 510 is configured to: receive SW_CS1 at its input 512; receive $V_{CP1}$ at its power input 516; receive $V_{OUT}$ at its ground terminal 518; and provide SW_CS2 at its output 514 responsive to SW_CS1, $V_{CP1}$, and $V_{OUT}$. With the switch controller 316A, the buffer 510 is enabled when $V_{REF2}$ is higher than $V_{ISNS}$. Otherwise, when $V_{REF2}$ is lower than $V_{ISNS}$, the buffer is disabled. In this manner, $Q_M$ and/or $Q_{AUX}$ are turned off or limited responsive to an overcurrent condition even if SW_CS1 is asserted.

Figure 6:
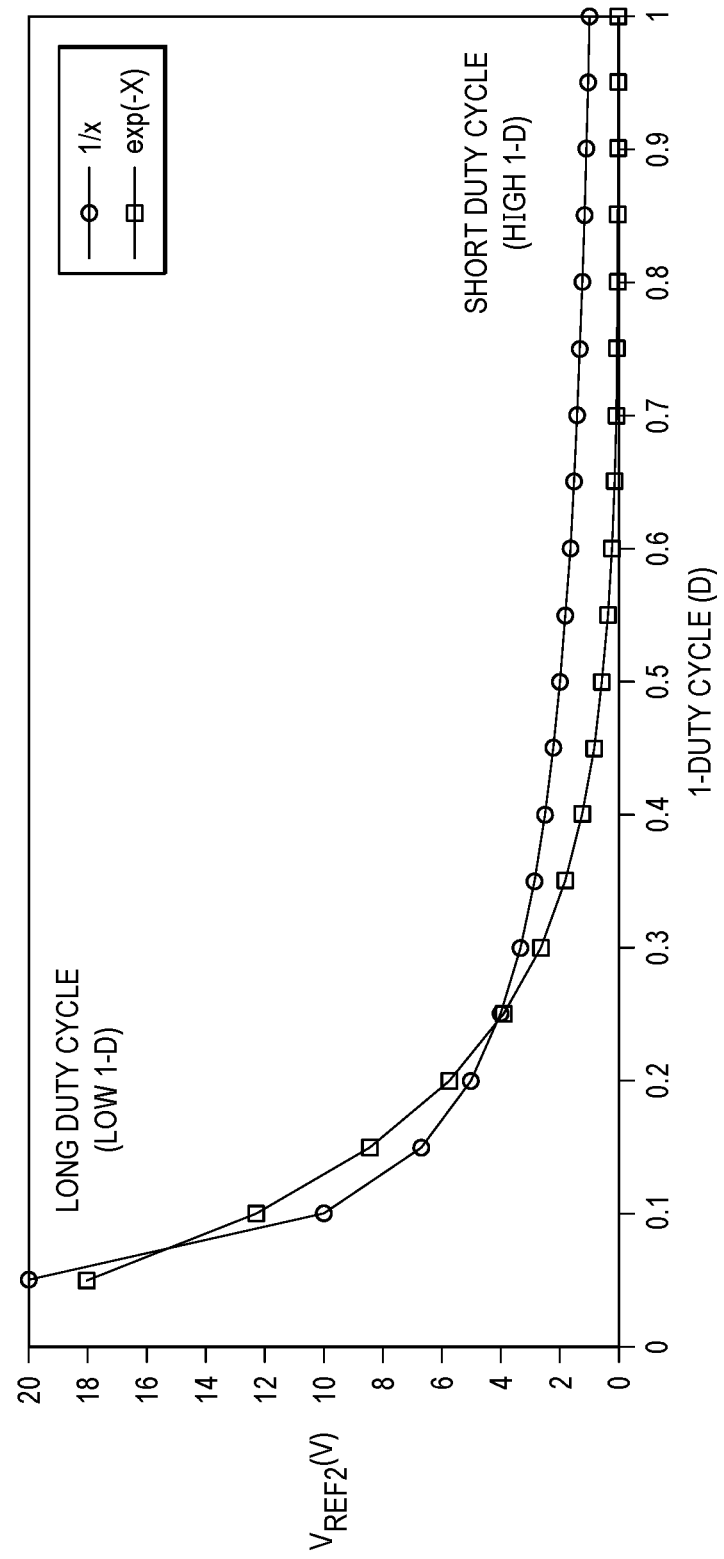
FIG. 6 is a graph comparing dynamic scaling results as a function of (1-duty-cycle) based on an exp(-X) scaling and a 1/x scaling.

FIG. 6 is a graph 600 comparing dynamic scaling results (e.g., $V_{REF2}$ herein) as a function of (1-duty-cycle) based on an exp(–X) scaling and 1/x scaling. Hereafter, duty-cycle is sometimes referred to as D. In graph 600, $V_{REF2}$ as a function of 1-D is one example of the dynamic scaling that may be performed by a dynamic scaling circuit. As shown, $V_{REF2}$ is high when the D is high (i.e., when 1-D is low on a scale of 0 to 1). When D is low (i.e., when 1-D is high on a scale of 0 to 1), $V_{REF2}$ is low. Compared to the 1/x scaling (which is the target behavior), the exp(–X) scaling is initially steeper and the final slope is more gradual. In some examples, a dynamic scaling circuit generates $V_{REF2}$ by optimizing an exp(–X) scaling over a small region of D to better approximate a 1/x scaling.

Figure 7:
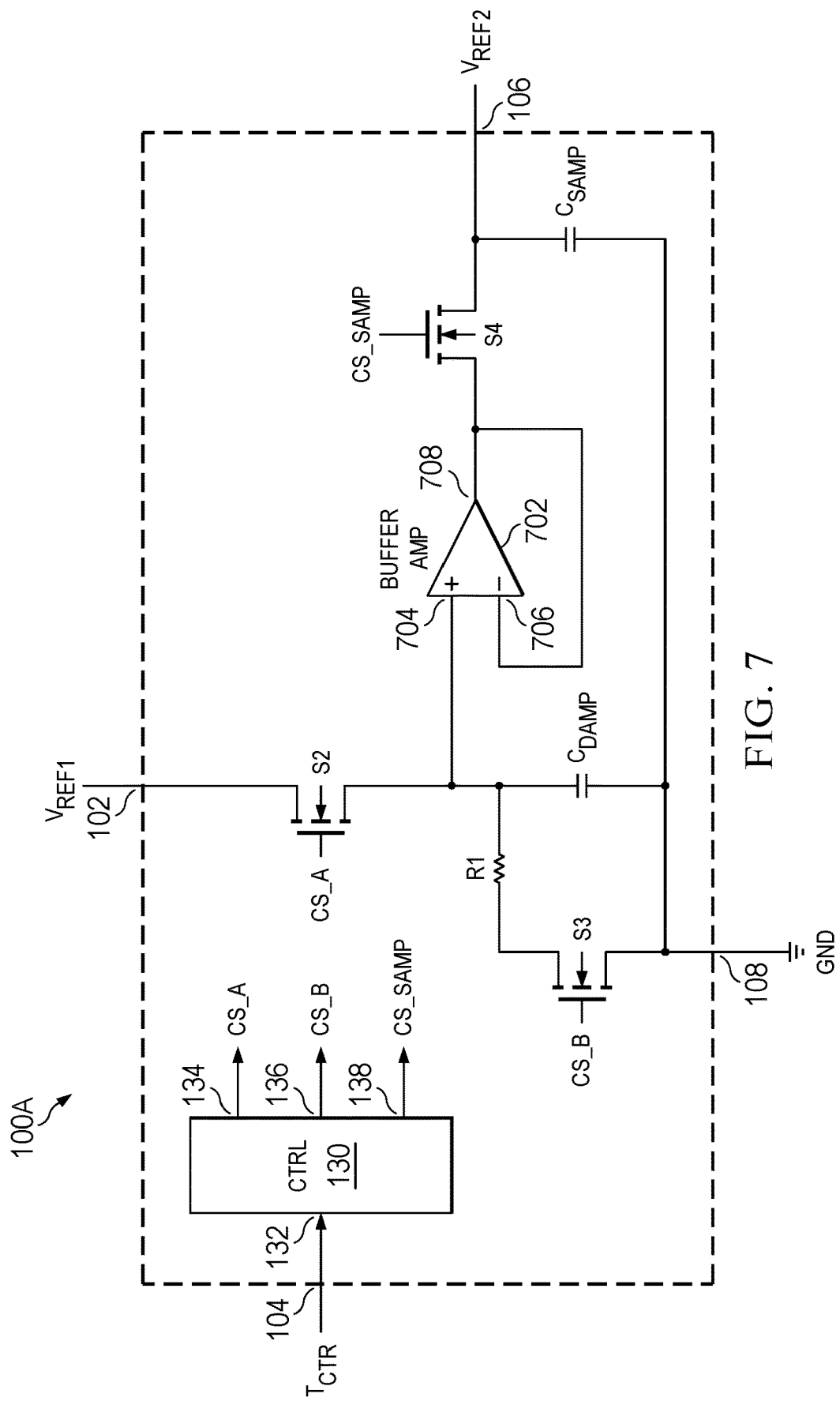
FIG. 7 is a schematic diagram showing a dynamic scaling circuit with a single resistor-capacitor (RC) circuit in accordance with an example embodiment.

FIG. 7 is a schematic diagram showing a dynamic scaling circuit 100A with a single resistor-capacitor (RC) circuit in accordance with an example embodiment. With a single RC circuit, the dynamic scaling circuit 100A performs first-order dynamic scaling operations. The dynamic scaling circuit 100A is an example of the dynamic scaling circuit 100 of FIG. 1. As shown, the dynamic scaling circuit 100A has the first input 102, the second input 104, the output 106, and the ground terminal 108 described in FIG. 1. The dynamic scaling circuit 100A includes transistors S2, S3, and S4, a damping capacitor ($C_{DAMP}$), a resistor R1, a buffer amplifier 702, and a sampling capacitor ($C_{SAMP}$) in the arrangement shown. The dynamic scaling circuit 100A also includes the controller 130.

Each of the switches S2, S3, and S4 includes a respective first current terminal, a respective second current terminal, and a respective control terminal. Each of R1, $C_{DAMP}$, and $C_{SAMP}$ has a respective first side and a respective second side. The buffer amplifier 702 has a non-inverting input 704, an inverting input 706, and an output 708. The controller 130 has the input 132, the first output 134, the second output 136, and the third output 138.

As shown, the first current terminal of S2 is coupled to the first input 102 of the dynamic scaling circuit 100A. The second current terminal of S2 is coupled to the first side of R1, the first side of $C_{DAMP}$, and the non-inverting input 704 of the buffer amplifier 702. The control terminal of S2 is coupled to the first output 134 of the controller 130. The second side of $C_{DAMP}$ is coupled to the ground terminal 108 of the dynamic scaling circuit 100A. The second side of R1 is coupled to the first current terminal of S3. The second current terminal of S3 is coupled to the ground terminal 108 of the dynamic scaling circuit 100A. The control terminal of S3 is coupled to the second output 136 of the controller 130. The inverting input 706 of the buffer amplifier 702 is coupled to the output 708 of the buffer amplifier 702 and to the first current terminal of S4. The second current terminal of S4 is coupled to the first side of $C_{SAMP}$ and to the output 106 of the dynamic scaling circuit 100A. The control terminal of S4 is coupled to the third output 138 of the controller 130. The second side of $C_{SAMP}$ is coupled to the ground terminal 108 of the dynamic scaling circuit 100A.

In FIG. 7, S2, S3, R1, and $C_{DAMP}$ are example components of the damping control circuit 110 of FIG. 1. In such case, the first current terminal S2 is or couples to the first input 112 of the damping control circuit 110. The control terminal of S2 is or couples to the second input 114 of the damping control circuit 110. The control terminal of S3 is or couples to the third input 115 of the damping control circuit 110.

In FIG. 7, S4 and $C_{SAMP}$ are example components of the sampling circuit 120 of FIG. 1. In such case, the first current terminal S4 is or couples to the first input 122 of the sampling circuit 120. The control terminal of S4 is or couples to the second input 123 of the sampling circuit 120.

In operation, the controller 130 is configured to: receive $T_{CTL}$ at its input 132; provide CS_A at its first output 134 responsive to $T_{CTL}$; provide CS_B at its second output 136 responsive to $T_{CTL}$; and provide CS_SAMP at its third output 138 responsive to $T_{CTL}$. In some examples, $T_{CTL}$=SW_CS1 or other another signal that indicates an on-time for a target switch (e.g., $Q_M$ or $Q_{AUX}$). In some examples, CS_A is asserted while $T_{CTL}$ is asserted, CS_B is asserted while $T_{CTL}$ is de-asserted, and CS_SAMP is pulsed when $T_{CTL}$ transitions from de-asserted to asserted.

The operations of dynamic scaling circuit 100A can be separated into different time intervals associated with CS_A, CS_B, and CS_SAMP. When S2 is turned on by CS_A, $C_{DAMP}$ is charged during a charge time interval up to $V_{REF1}$. In some examples, the charge time interval is repeated multiple times to charge $C_{DAMP}$ responsive to $V_{REF1}$. Once $C_{DAMP}$ is charged to a threshold level or is charged a threshold number of times by turning on S2, CS_B is asserted while CS_A is de-asserted. While CS_B is asserted and CS_A is de-asserted, $C_{DAMP}$ is discharged through R1 for a discharge time interval during the off-time of a target switch. After the discharge time interval, S4 is turned on for a sampling time interval by pulsing CS_SAMP. During the sampling time interval, $C_{SAMP}$ is charged responsive to the charge remaining on $C_{DAMP}$ once the discharge time interval is complete. In some examples, the buffer amplifier 702 is used to enable $C_{SAMP}$ to be charged more quickly responsive to the charge remaining on $C_{DAMP}$ once the discharge time interval is complete. In other examples, the buffer amplifier 702 is omitted. In such examples, the first current terminal of S4 is coupled to the first side of $C_{DAMP}$. The charge on $C_{SAMP}$ is provided to the output 106 of the dynamic scaling circuit 100A as $V_{REF2}$.

With the dynamic scaling circuit 100A, $V_{REF1}$ is scaled down responsive to $T_{CTL}$ such that the scaling operation is responsive to the duty-cycle of a target switch. To the extent the target switch is on for more time, the discharge time interval will be shorter and $V_{REF2}$ will be scaled down less relative to $V_{REF1}$. To the extent the target switch is on for less time, the discharge time interval will be longer and $V_{REF2}$ will be scaled down more relative to $V_{REF1}$. In some examples, the dynamic scaling circuit 100A is optimized for a predetermined duty-cycle range. In some examples, the scaling of $V_{REF1}$ to obtain $V_{REF2}$ corresponds to a negative exponential scaling.

In some examples, a dynamic scaling circuit such as the dynamic scaling circuit 100A uses a damped exponential RC circuit to scale $V_{REF1}$. The capacitor (e.g., $C_{DAMP}$) of the RC circuit is charged based on $V_{REF1}$ and one or more charge time intervals. In some examples, the charge time intervals correspond to on-time intervals of a target switch. The capacitor of the RC circuit is then discharged by a resistor for a discharge time interval. In some examples, the discharge time interval corresponds to an off-time interval of the target switch. The charge on the capacitor at the end of the discharge time internal is sampled and/or held. In some examples, the value of the resistor is selected based on the operating frequency of the target switch.

Figure 8:
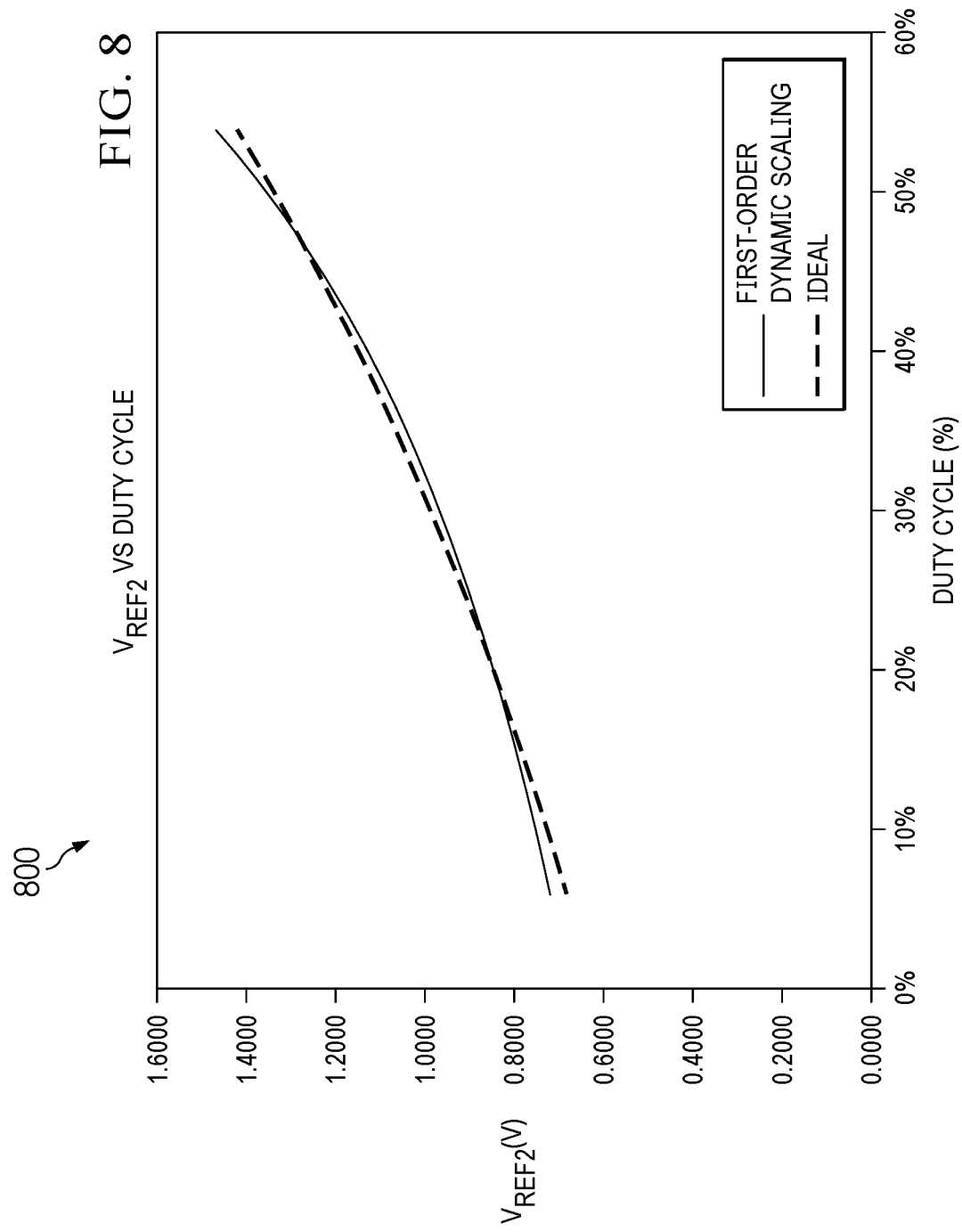
FIG. 8 is a graph comparing dynamic scaling results as a function of duty-cycle for first-order dynamic scaling relative to an ideal curve.

FIG. 8 is a graph 800 comparing dynamic scaling results (e.g., $V_{REF2}$ herein) as a function of duty-cycle for first-order dynamic scaling (e.g., the dynamic scaling circuit 100A of FIG. 7) relative to an ideal curve. In graph 800, $V_{REF2}$ as a function of duty-cycle is one example of the dynamic scaling that may be performed by a dynamic scaling circuit. As shown in graph 800, first-order dynamic scaling may be used to approximate the ideal curve for a duty-cycle range of about 10% to about 50%. In some examples, a dynamic scaling circuit performs first-order dynamic scaling to generate $V_{REF2}$.

Figure 9:
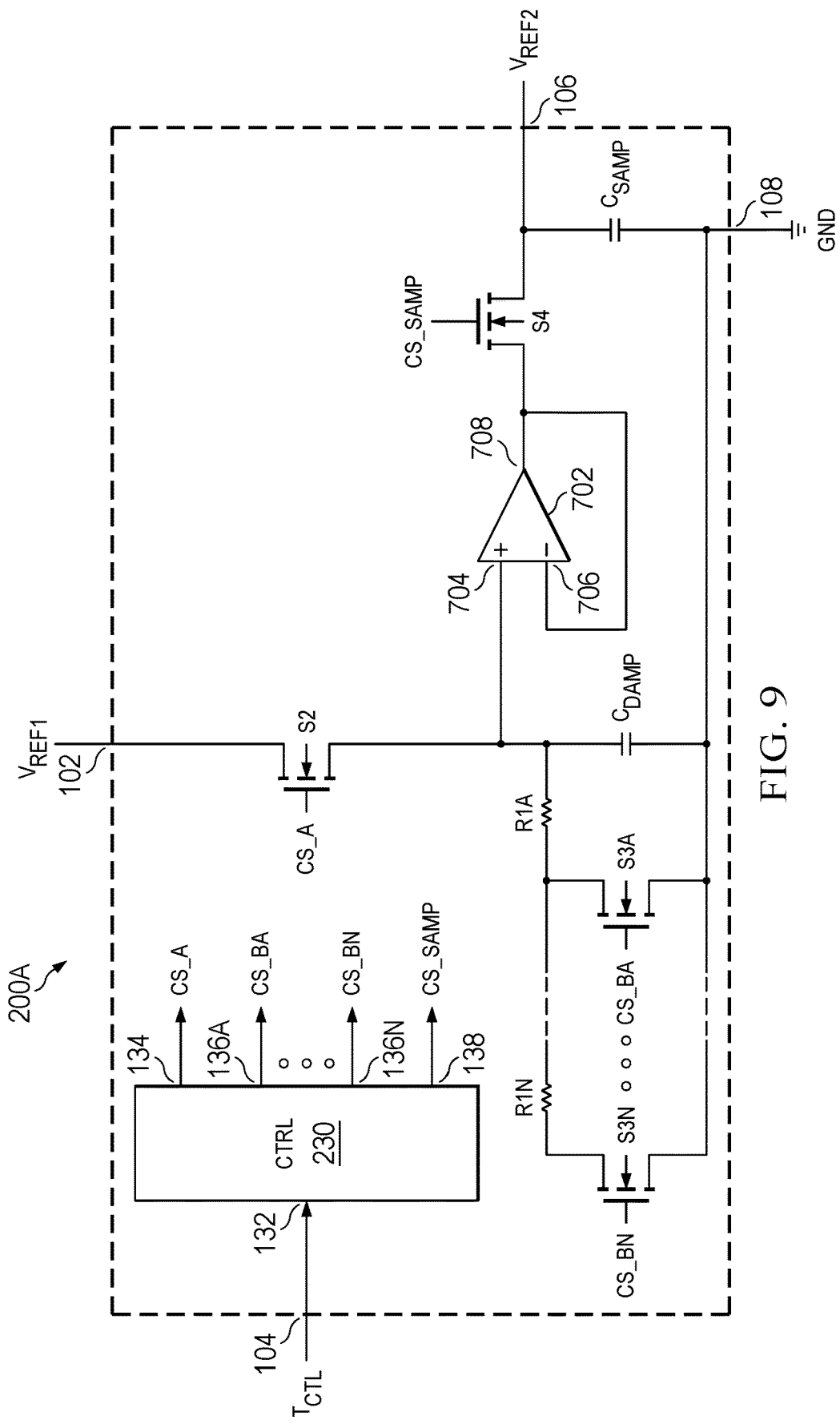
FIG. 9 is a schematic diagram showing a dynamic scaling circuit with multiple resistor-capacitor (RC) circuits in accordance with an example embodiment.

FIG. 9 is a schematic diagram showing a dynamic scaling circuit 200A with multiple RC circuits in accordance with an example embodiment. With multiple RC circuits, the dynamic scaling circuit 200A performs multi-order dynamic scaling operations. The dynamic scaling circuit 200A is an example of the dynamic scaling circuit 200 of FIG. 2. As shown, the dynamic scaling circuit 200A has the first input 102, the second input 104, the output 106, and the ground terminal 108 described in FIG. 2. The dynamic scaling circuit 200A includes transistors S2, S3A to S3N, and S4, $C_{DAMP}$), resistors R1A to R1N, the buffer amplifier 702, and $C_{SAMP}$ in the arrangement shown. The dynamic scaling circuit 200A also includes the controller 230 for the transistors S2, S3A to S3N, and S4.

Each of the switches S2, S3A to S3N, and S4 includes a respective first current terminal, a respective second current terminal, and a respective control terminal. Each of R1A to R1N, $C_{DAMP}$, and $C_{SAMP}$ has a respective first side and a respective second side. The buffer amplifier 702 has the non-inverting input 704, the inverting input 706, and the output 708 described in FIG. 7. The controller 230 has the input 132, a first output 134, a set of second outputs 136A to 136N, and a third output 138.

The first current terminal of S2 is coupled to the first input 102 of the dynamic scaling circuit 200A. The second current terminal of S2 is coupled to the first side of R1A, the first side of $C_{DAMP}$, and the non-inverting input 704 of the buffer amplifier 702. The control terminal of S2 is coupled to the first output 134 of the controller 230. The second side of $C_{DAMP}$ is coupled to the ground terminal 108 of the dynamic scaling circuit 200A. The second side of R1A is coupled to the first current terminal of S3A. The second current terminal of S3A is coupled to the ground terminal 108 of the dynamic scaling circuit 200A. The control terminal of S3A is coupled to a first output 136A of the set of second outputs 136A to 136N of the controller 230. In the example of FIG. 9, the first side of R1N is coupled to the first current terminal of S3A. The second side of R1N is coupled to the first current terminal of S3N. The second current terminal of S3N is coupled to the ground terminal 108 of the dynamic scaling circuit 200A. The control terminal of S3N is coupled to an Nth output 136N of the set of second outputs 136A to 136N of the controller 230. In some examples, the dynamic scaling circuit 200A includes two RC circuits (i.e., N=2). In other examples, the dynamic scaling circuit 200A includes more than two RC circuits (i.e., N=3 or more).

The inverting input 706 of the buffer amplifier 702 is coupled to the output 708 of the buffer amplifier 702 and to the first current terminal of S4. The second current terminal of S4 is coupled to the first side of $C_{SAMP}$ and to the output 106 of the dynamic scaling circuit 200A. The control terminal of S4 is coupled to the third output 138 of the controller 230. The second side of $C_{SAMP}$ is coupled to the ground terminal 108 of the dynamic scaling circuit 100.

In operation, the controller 230 is configured to: receive $T_{CTL}$ at its input 132; provide CS_A at its first output 134 responsive to $T_{CTL}$; provide CS_BA to CS_BN at its set of second outputs 136A to 136N responsive to $T_{CTL}$ and one or more timers; and provide CS_SAMP at its third output 138 responsive to $T_{CTL}$. In some examples, $T_{CTL}$=SW_CS1 or other another signal that indicates an on-time for a target switch (e.g., $Q_M$ or $Q_{AUX}$). In some examples, CS_A is asserted while $T_{CTL}$ is asserted, CS_BA to CS_BN are asserted sequentially (one at a time) while $T_{CTL}$ is de-asserted, and CS_SAMP is pulsed when $T_{CTL}$ transitions from de-asserted to asserted. In some examples, CS_BA up to CS_BN are asserted sequentially (one at a time) during a discharge time interval to adjust the discharge rate of $C_{DAMP}$ (i.e., to vary the resistance of discharge provided by coupling R1A up to R1N in series).

The operations of dynamic scaling circuit 200A can be separated into different time intervals associated with CS_A, CS_BA to CS_BN, and CS_SAMP. When S2 is turned on by CS_A, $C_{DAMP}$ is charged during a charge time interval up to $V_{REF1}$. In some examples, the charge time interval is repeated multiple times to charge $C_{DAMP}$ responsive to $V_{REF1}$. Once $C_{DAMP}$ is charged to a threshold level or is charged a threshold number of times by turning on S2, CS_BA is asserted while CS_A is de-asserted. While CS_BA is asserted and CS_A is de-asserted, $C_{DAMP}$ is discharged through R1A for a first discharge time interval during the off-time of a target switch. After the first discharge time interval is complete, CS_A and CS_BA are de-asserted while a subsequent control signal up to CS_BN is asserted. When CSA and CS_BA are off while a subsequent control signal up to CS_BN is asserted, $C_{DAMP}$ is discharged through R1A up to R1N during subsequent discharge time intervals. Without limitation, each subsequent discharge time interval may slow the discharge rate of $C_{DAMP}$ by adding an additional resistor in series and turning on a respective switch. After the discharge time intervals are complete, S4 is turned on for a sampling time interval by pulsing CS_SAMP. During the sampling time interval, $C_{SAMP}$ is charged responsive to the charge remaining on $C_{DAMP}$ once the discharge time interval is complete. In some examples, the buffer amplifier 702 is used to enable $C_{SAMP}$ to be charged more quickly responsive to the charge remaining on $C_{DAMP}$ once the discharge time interval is complete. In other examples, the buffer amplifier 702 is omitted. In such examples, the first current terminal of S4 is coupled to the first side of $C_{DAMP}$. The charge on $C_{SAMP}$ is provided to the output 106 of the dynamic scaling circuit 100A as $V_{REF2}$.

With the dynamic scaling circuit 200A, $V_{REF1}$ is scaled down responsive to $T_{CTL}$ such that the scaling operation is responsive to the duty-cycle of a target switch and additional discharge control timers. To the extent the target switch is on for more time, the discharge time interval will be shorter and $V_{REF2}$ will be scaled down less relative to $V_{REF1}$. To the extent the target switch is on for less time, the discharge time interval will be longer and $V_{REF2}$ will be scaled down more relative to $V_{REF1}$. In some examples, the dynamic scaling circuit 200A is optimized for a predetermined duty-cycle range.

In some examples, a dynamic scaling circuit such as the dynamic scaling circuit 200A uses damped exponential RC circuits to scale $V_{REF1}$. The capacitor (e.g., $C_{DAMP}$) of the RC circuits is charged based on $V_{REF1}$ and one or more charge time intervals. In some examples, the charge time intervals correspond to on-time intervals of a target switch. The capacitor of the RC circuits is then discharged through different combinations of resistors for sequential discharge time intervals. The sequential discharge time intervals occur during an off-time interval of the target switch. The charge on the capacitor at the end of the discharge time internals is sampled and/or held. In some examples, the value of the resistors (e.g., R1A to R1N) are selected based on the operating frequency of the target switch.

Figure 10:
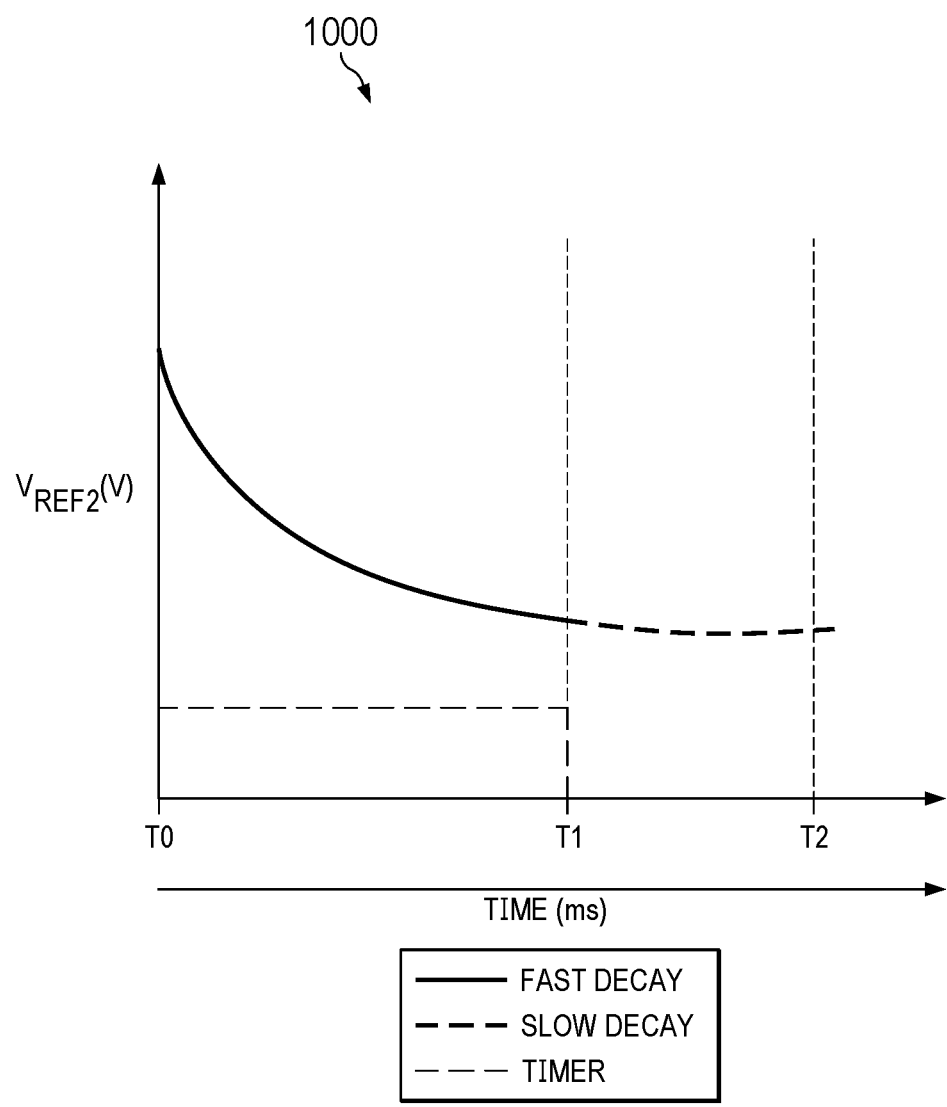
FIG. 10 is a graph showing dynamic scaling results as a function of time for a discharge time interval of the dynamic scaling circuit of FIG. 9.

FIG. 10 is a graph 1000 showing dynamic scaling results (e.g., $V_{REF2}$ herein) as a function of time for a discharge time interval of the dynamic scaling circuit 200A of FIG. 9. In graph 1000, $V_{REF2}$ as a function of time is one example of the dynamic scaling that may be performed by a dynamic scaling circuit. In graph 1000, the discharge time interval has a first portion and a second portion. The first portion is from T0 to T1. The second portion is from T1 to T2. From T0 to T1, the discharge rate of the first portion is higher than the discharge rate of the second portion. For example, the discharge rate of the first portion may be based on discharging $C_{DAMP}$ through a first resistor (e.g., R1A). From T1 to T2, the discharge rate of the second portion is lower than the discharge rate of the first portion. For example, the discharge rate of the second portion may be based on discharging $C_{DAMP}$ through a series of resistors (e.g., R1A up to R1N).

FIG. 11 is a graph 1100 comparing dynamic scaling results (e.g., $V_{REF2}$) as a function of duty-cycle for second-order dynamic scaling (e.g., the dynamic scaling circuit 200A of FIG. 9) relative to an ideal curve. As shown in graph 1100, second-order dynamic scaling may be used to approximate the ideal curve for a duty-cycle range of about 10% to about 50%. Compared to first-order dynamic scaling as in graph 800, the second-order dynamic scaling represented in graph 1100 follows the ideal curve more closely.

With dynamic scaling circuits as described herein, analog multipliers or dividers are avoided, which eliminates matching requirements. Also, dynamic scaling circuits may be built without any amplifiers or feedback to avoid offsets and compensation. As desired the dynamic scaling operations of a dynamic scaling circuit can be fine-tuned relative to a target scaling (e.g., 1/x) by adjusting or trimming the R and C values in each RC circuit used.

In some examples, a dynamic scaling circuit includes: a damping control circuit; a sampling circuit; and a controller. Examples of the damping control circuit include the damping control circuit 110 in FIG. 1, the damping control circuit 202 in FIG. 2, the RC circuit and related control switches in FIG. 7, or the RC circuits and related control switches in FIG. 9. Examples of the sampling circuit include the sampling circuit 120 of FIGS. 1 and 2, or the sampling components (e.g., S4, $C_{SAMP}$, and optional buffer amplifier 702) of FIGS. 7 and 9. Examples of the controller include the controller 130 in FIGS. 1 and 7, or the controller 230 in FIGS. 2 and 9. In some examples, the damping control circuitry has a first input, a second input, a third input, an output, and a ground terminal. The sampling circuit has a first input, a second input, an output, and a ground terminal. The first input of the sampling circuit is coupled to the output of the damping control circuit. The controller has an input, a first output, a second output, and a third output. The first output of the controller is coupled to the second input of the damping control circuit. The second output of the controller is coupled to the third input of the damping control circuit. The third output of the controller coupled to the second input of the sampling circuit.

In some examples, the damping control circuit includes: a transistor (e.g., S2 in FIGS. 7 and 9); and a capacitor (e.g., $C_{DAMP}$ in FIGS. 7 and 9). The transistor has a first current terminal, a second current terminal, and a control terminal. The first current terminal is coupled to the first input (e.g., the first input 112 in FIGS. 1 and 2) of the damping control circuit. The control terminal is coupled to the second input (e.g., the second input 114 in FIGS. 1 and 2) of the damping control circuit. The capacitor has a first side and a second side. The first side of the capacitor coupled to the second current terminal. The second side of the capacitor coupled to the ground terminal (e.g., the ground terminal 118 in FIGS. 1 and 2) of the damping control circuit.

In some examples, the transistor (e.g., S2) is a first transistor and the damping control circuit includes: a resistor (e.g., R1 in FIG. 7, or R1A in FIG. 9); and a second transistor (e.g., S3 in FIG. 7, or S3A in FIG. 9) in series with the resistor between the first side of the capacitor and the ground terminal of the damping control circuit. The second transistor has a control terminal that is coupled to the third input (e.g., the third input 115 in FIG. 1, or a first input 115A of the set of third inputs 115A to 115N in FIG. 2) of the damping control circuit.

In some examples, the transistor (e.g., S2) is a first transistor, the damping control circuit has a fourth input (e.g., 115N in FIG. 2), the controller has a fourth output (e.g., 136N in FIG. 2) coupled to the fourth input of the damping control circuit, and the damping control circuit includes: a first resistor (R1A in FIG. 9); a second transistor (e.g., S3A in FIG. 9) in series with the first resistor between the first side of the capacitor and the ground terminal of the damping control. The second transistor has a control terminal that is coupled to the third input (e.g., the first input 115A of the set of third inputs 115A to 115N in FIG. 2) of the damping control circuit. In such examples, the damping control circuit may also include: a second resistor (e.g., R1N in FIG. 9); and a third transistor (e.g., S3N in FIG. 9) in series with the second resistor between the first resistor and the ground terminal of the damping control circuit. The third transistor has a control terminal that is coupled to the fourth input of the damping control circuit.

In some examples, the sampling circuit includes: a transistor (e.g., S4 in FIGS. 7 and 9); and a capacitor (e.g., $C_{SAMP}$ in FIGS. 7 and 9). The transistor has a first current terminal, a second current terminal, and control terminal. The first current terminal is coupled to the first input (e.g., the first input 122 in FIGS. 1 and 2) of the sampling circuit. The second current terminal is coupled to the output (e.g., the output 124 in FIGS. 1 and 2) of the sampling circuit. The control terminal is coupled to the second input (e.g., the second input 123 in FIGS. 1 and 2) of the sampling circuit. The capacitor has a first side and a second side. The first side of the capacitor coupled to the second current terminal (e.g., the second current terminal of S4 in FIGS. 7 and 9). The second side of the capacitor coupled to the ground terminal (e.g., the ground terminal 126 in FIGS. 1 and 2) of the sampling circuit.

In some examples, the sampling circuit includes: a buffer amplifier (e.g., the buffer amplifier 702 in FIGS. 7 and 9); a transistor (e.g., S4 in FIGS. 7 and 9); and a capacitor (e.g., $C_{SAMP}$ in FIGS. 7 and 9). The buffer amplifier has a non-inverting input, an inverting input, and an output. The non-inverting input (e.g., the non-inverting input 704 in FIGS. 7 and 9) is coupled to the first input of the sampling circuit. The inverting input (e.g., the inverting input 706 in FIGS. 7 and 9) is coupled to the output (e.g., the output 708 in FIGS. 7 and 9) of the buffer amplifier. The transistor has a first current terminal, a second current terminal, and control terminal. The first current terminal of the sampling circuit transistor is coupled to the output of the buffer amplifier. The second current terminal is coupled to the output of the sampling circuit. The control terminal is coupled to the second input of the sampling circuit. The capacitor (e.g., $C_{SAMP}$ in FIGS. 7 and 9) has a first side and a second side. The first side of the capacitor is coupled to the second current terminal of the sampling circuit transistor. The second side of the capacitor coupled to the ground terminal of the sampling circuit.

In some examples, the damping control circuit is configured to: receive a reference voltage (e.g., $V_{REF1}$ herein) at its first input; receive a first switch control signal (e.g., CS_A herein) at its second input; receive a second switch control signal (e.g., CS_B herein) at its third input; and provide an exponentially damped value ($V_{DAMPED}$), relative to the reference voltage, at its output responsive to the reference voltage, the first switch control signal, and the second switch control signal. In some examples, the sampling circuit is configured to: receive the exponentially damped value at its first input; receive a third switch control signal (e.g., CS_SAMP herein) at its second input; and sample the exponentially damped value responsive to third switch control signal.

In some examples, a circuit includes a switch controller (e.g., the switch controller 316 in FIGS. 3 and 4, or the switch controller 316A in FIG. 5). The switch controller includes: a reference voltage source (e.g., the reference controller 338 in FIG. 3, or the $I_{OUT}$ regulation DAC 338A in FIG. 5) configured to provide a reference voltage; a timing controller (e.g., the timing controller 344 in FIG. 3) configured to provide a timing signal (e.g., $T_{CTL}$ herein); a dynamic scaling circuit (e.g., the dynamic scaling circuit 100 in FIG. 1, the dynamic scaling circuit 200 in FIG. 2, the dynamic scaling circuit 100A in FIG. 7, the dynamic scaling circuit 200A in FIG. 9) configured to provide a damped value (VREF2) relative to the reference voltage responsive to the timing signal; and control circuitry (e.g., the controller 360 in FIG. 3) configured to provide a switch control signal (e.g., CS2) responsive to the damped value.

In some examples, the dynamic scaling circuit includes: a controller (e.g., the controller 130 in FIGS. 1 and 7) configured to generate a first switch control signal (e.g., CS_A), a second switch control signal (e.g., CS_B), and a third switch control signal (e.g., CS_SAMP) responsive to the timing signal; a damping control circuit (e.g., the damping control circuit 110 in FIG. 1, or related components in FIG. 7) configured to control charge on a capacitor (e.g., $C_{DAMP}$) responsive to the reference voltage, the first switch control signal, and the second switch control signal; and a sampling circuit (e.g., the sampling circuit 120 in FIG. 1, or related components in FIG. 7) configured to sample a charge on the capacitor responsive to the third switch control signal.

In some examples, the dynamic scaling circuit is configured to scale the reference voltage based on: charging a capacitor (e.g., $C_{DAMP}$) for a first time interval responsive to the reference voltage and the first switch control signal; discharging the capacitor through a resistor (e.g., R1 in FIG. 7) for a second time interval after the first time interval responsive to the second switch control signal; and sampling a charge on the capacitor after the second time interval responsive to the third switch control signal.

In some examples, the dynamic scaling circuit includes: a controller (e.g., the controller 230 in FIGS. 2 and 9) configured to generate a first switch control signal (e.g., CS_A), a second switch control signal (e.g., CS_BA), a third switch control signal (e.g., CS_BN), and a fourth switch control signal (CS_SAMP) responsive to the timing signal; a damping control circuit (e.g., the damping control circuit 202 in FIG. 2, or related components in FIG. 9) configured control charge on a capacitor (e.g., $C_{DAMP}$ in FIG. 9) responsive to the reference voltage, the first switch control signal, the second switch control signal, and the third switch control signal; and a sampling circuit (e.g., the sampling circuit 120 in FIG. 2, or related components in FIG. 9) configured sample a charge on the capacitor responsive to the fourth switch control signal.

In some examples, the timing signal is a first timing signal and the dynamic scaling circuit is configured to scale the reference voltage based on: charging a capacitor (e.g., $C_{DAMP}$) for a first time interval responsive to the reference voltage and the first switch control signal; discharging the capacitor through a first resistor (e.g., R1A in FIG. 9) for a second time interval after the first time interval responsive to the second switch control signal; discharging the capacitor through a first resistor and a second resistor (e.g., R1N in FIG. 9) in series with the first resistor for a third time interval after the second time interval responsive to the third switch control signal; and sampling a charge on the capacitor after the second time interval responsive to the fourth switch control signal.

In some examples, the circuit includes a switch (e.g., S1 in FIG. 3, $Q_M$ in FIG. 5, or $Q_{AUX}$ in FIG. 5) controlled by the switch controller. The switch is, for example, part of power management circuitry (e.g., the power management circuitry 304 in FIG. 3, the charger 412 in FIG. 4, or related components in FIG. 5) for a mobile device. In some examples, the reference voltage (e.g., $V_{REF1}$) indicates a current limit for the power management circuitry. In some examples, a circuit includes a switch (e.g., S1 in FIG. 3, $Q_M$ in FIG. 5, or $Q_{AUX}$ in FIG. 5) controlled by the switch controller, where the switch is part of a charger for a mobile device. In some examples, the reference voltage (e.g., $V_{REF1}$) indicates a current limit for the charger.

In some examples, a system includes: mobile device circuitry (e.g., the mobile device circuitry 424 in FIG. 4); and power management circuitry (e.g., the power management circuitry 304 in FIG. 3, the charger 412 in FIG. 4, or related components in FIG. 5) coupled to the mobile device circuitry. The power management circuitry includes a switch (e.g., S1 in FIG. 3, a switch of the charger 412, $Q_M$ in FIG. 5, or $Q_{AUX}$ in FIG. 5) and a switch controller (e.g., the switch controller 316 in FIGS. 3 and 4, or the switch controller 316A in FIG. 5). The switch controller includes a dynamic scaling circuit configured to: receive a reference voltage (e.g., $V_{REF1}$) and a timing signal (e.g., $T_{CTL}$); generate a first switch control signal (e.g., CS_A), a second switch control signal (e.g., CS_B), and a third switch control signal (CS_SAMP) responsive to the timing signal; control charge on a capacitor (e.g., $C_{DAMP}$) responsive to the reference voltage, the first switch control signal, and the second switch control signal; and sample a charge on the capacitor responsive to the third switch control signal.

In some examples, the dynamic scaling circuit is configured to scale the reference voltage based on: charging the capacitor for a first time interval responsive to the reference voltage and the first switch control signal; discharging the capacitor through a resistor for a second time interval after the first time interval responsive to the second switch control signal; and sampling a charge on the capacitor after the second time interval responsive to the third switch control signal. In some examples, the timing signal (e.g., $T_{CTL}$) is a first timing signal, the controller is configured to generate a fourth switch control signal (e.g., CS_BN) responsive to the first timing signal and a second timing signal (e.g., a timer initiated responsive to $T_{CTL}$ or another switch off-time indicator) and the dynamic scaling circuit is configured to scale the reference voltage based on: charging the capacitor (e.g., $C_{DAMP}$) for a first time interval responsive to the reference voltage and the first switch control signal; discharging the capacitor through a first resistor (e.g., R1A) for a second time interval after the first time interval responsive to the second switch control signal; discharging the capacitor through the first resistor and a second resistor (e.g., R1N) in series with the first resistor for a third time interval after the second time interval responsive to the fourth switch control signal; and sampling a charge on the capacitor after the third time interval responsive to the third switch control signal.

In some examples, the power management circuitry includes a charger (e.g., the charger 412 in FIG. 4, or related components in FIG. 5) having a first input (e.g., the first input 414 in FIG. 4), a second input (e.g., the second input 416 in FIG. 4), a third input (e.g., the third input 418 in FIG. 4), and an output (e.g., the output 420 in FIG. 4). The first input is configured to receive power from an AC-DC adapter (e.g., the AC-DC adapter 402 in FIG. 4). The second input is configured to receive power from wireless charging circuitry (e.g., the wireless charging circuitry 408 in FIG. 4). The third input is configured to receive power from a battery (e.g., the battery 428 in FIG. 4. The charger is configured to limit current to the output responsive to operations of the dynamic scaling circuit. In some examples, the power management circuitry includes a switch (e.g., S1 in FIG. 3, a switch of the charger 412, $Q_M$, or $Q_{AUX}$) and the dynamic scaling circuit includes a damped exponential RC circuit (e.g., $C_{DAMP}$, R1, and related switches in FIG. 7, or $C_{DAMP}$, R1A to R1N, and related switches in FIG. 9) configured to scale a current limit reference voltage (e.g., $V_{REF1}$) for the power management circuitry responsive to a duty-cycle of the switch.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") such as an NFET or a PFET, a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control terminal and its first and second terminals. In the context of a FET, the control terminal is the gate, and the first and second terminals are the drain and source. In the context of a BJT, the control terminal is the base, and the first and second terminals are the collector and emitter.

References herein to a FET being "ON" means that the conduction channel of the FET is present and drain current may flow through the FET. References herein to a FET being "OFF" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

What is claimed is:

1. A dynamic scaling circuit comprising:
   a damping control circuit having a first input, a second input, a third input, an output, and a ground terminal;
   a sampling circuit having a first input, a second input, an output, and a ground terminal, the first input of the sampling circuit coupled to the output of the damping control circuit; and
   a controller having an input, a first output, a second output, and a third output, the first output of the controller coupled to the second input of the damping control circuit, the second output of the controller coupled to the third input of the damping control circuit, and the third output of the controller coupled to the second input of the sampling circuit.

2. The dynamic scaling circuit of claim 1, wherein the damping control circuit includes:
   a transistor having a first current terminal, a second current terminal, and a control terminal, the first current terminal coupled to the first input of the damping control circuit, the control terminal coupled to the second input of the damping control circuit; and
   a capacitor having a first side and a second side, the first side of the capacitor coupled to the second current terminal, the second side of the capacitor coupled to the ground terminal of the damping control circuit.

3. The dynamic scaling circuit of claim 2, wherein the transistor is a first transistor and the damping control circuit includes:
   a resistor; and
   a second transistor in series with the resistor between the first side of the capacitor and the ground terminal of the damping control circuit, the second transistor having a control terminal that is coupled to the third input of the damping control circuit.

4. The dynamic scaling circuit of claim 2, wherein the transistor is a first transistor, the damping control circuit has a fourth input, the controller has a fourth output coupled to the fourth input of the damping control circuit, and the damping control circuit includes:
- a first resistor;
- a second transistor in series with the first resistor between the first side of the capacitor and the ground terminal of the damping control circuit, and the second transistor having a control terminal that is coupled to the third input of the damping control circuit;
- a second resistor; and
- a third transistor in series with the second resistor between the first resistor and the ground terminal of the damping control circuit, the third transistor having a control terminal that is coupled to the fourth input of the damping control circuit.

5. The dynamic scaling circuit of claim 1, wherein the sampling circuit includes:
- a transistor having a first current terminal, a second current terminal, and control terminal, the first current terminal coupled to the first input of the sampling circuit, the second current terminal coupled to the output of the sampling circuit, and the control terminal coupled to the second input of the sampling circuit; and
- a capacitor having a first side and a second side, the first side of the capacitor coupled to the second current terminal, and the second side of the capacitor coupled to the ground terminal of the sampling circuit.

6. The dynamic scaling circuit of claim 1, wherein the sampling circuit includes:
- a buffer amplifier having a non-inverting input, an inverting input, and an output, the non-inverting input coupled to the first input of the sampling circuit, the inverting input coupled to the output of the buffer amplifier;
- a transistor having a first current terminal, a second current terminal, and control terminal, the first current terminal coupled to the output of the buffer amplifier, the second current terminal coupled to the output of the sampling circuit, and the control terminal coupled to the second input of the sampling circuit; and
- a capacitor having a first side and a second side, the first side of the capacitor coupled to the second current terminal, and the second side of the capacitor coupled to the ground terminal of the sampling circuit.

7. The dynamic scaling circuit of claim 1, wherein the damping control circuit is configured to:
- receive a reference voltage at its first input;
- receive a first switch control signal at its second input;
- receive a second switch control signal at its third input; and
- provide an exponentially damped value, relative to the reference voltage, at its output responsive to the reference voltage, the first switch control signal, and the second switch control signal.

8. The dynamic scaling circuit of claim 7, wherein the sampling circuit is configured to:
- receive the exponentially damped value at its first input;
- receive a third switch control signal at its second input; and
- sample the exponentially damped value responsive to third switch control signal.

* * * * *